(12) United States Patent
Montmeat et al.

(10) Patent No.: US 11,569,115 B2
(45) Date of Patent: Jan. 31, 2023

(54) TEMPORARY BONDING METHOD

(71) Applicant: Commissariat à l'Énergie Atomique et aux Énergies Alternatives, Paris (FR)

(72) Inventors: Pierre Montmeat, Grenoble (FR); Frank Fournel, Grenoble (FR); Laurent Bally, Grenoble (FR); Thierry Enot, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 53 days.

(21) Appl. No.: 17/341,792

(22) Filed: Jun. 8, 2021

(65) Prior Publication Data

US 2021/0384061 A1    Dec. 9, 2021

(30) Foreign Application Priority Data

Jun. 9, 2020 (FR) ...................................... 2006027

(51) Int. Cl.
*H01L 21/683* (2006.01)
*B32B 9/00* (2006.01)
*B32B 37/00* (2006.01)
*B32B 38/10* (2006.01)

(52) U.S. Cl.
CPC .......... *H01L 21/6835* (2013.01); *B32B 9/005* (2013.01); *B32B 37/025* (2013.01); *B32B 38/10* (2013.01); *B32B 2457/00* (2013.01); *H01L 2221/68381* (2013.01)

(58) Field of Classification Search
CPC ............................. H01L 21/6835; B32B 38/10
See application file for complete search history.

(56) References Cited

U.S. PATENT DOCUMENTS

| | | | |
|---|---|---|---|
| 2014/0287567 A1* | 9/2014 | Takano | ............... H01L 21/2007 438/459 |
| 2015/0221517 A1* | 8/2015 | Kim | .................... H01L 21/6836 438/460 |

FOREIGN PATENT DOCUMENTS

WO    WO 2018/104513 A1    6/2018

OTHER PUBLICATIONS

Preliminary Search Report for French Application No. 2006027, dated Jan. 19, 2021.

* cited by examiner

*Primary Examiner* — Carson Gross
(74) *Attorney, Agent, or Firm* — Wolf, Greenfield & Sacks, P.C.

(57) ABSTRACT

A method of temporary bonding of an object having first and second opposite surfaces successively including bonding the object to a handle on the side of the first surface, bonding the object to a first adhesive film on the side of the second surface, bonding the first adhesive film to a second adhesive film on the side opposite to the object, and removing the handle from the object.

12 Claims, 4 Drawing Sheets

TEMPORARY BONDING METHOD

CROSS-REFERENCE TO RELATED APPLICATION

This application claims priority to French Patent Application 2006027, filed Jun. 9, 2020, the contents of which is incorporated herein by reference in its entirety.

TECHNICAL BACKGROUND

The present disclosure concerns a method of temporary bonding of an object, particularly an electric component wafer.

PRIOR ART

The dimensions of certain objects make their direct handling to perform a treatment difficult. This is particularly true for a thin object, for example, a wafer having a thickness smaller than 200 µm. To handle such an object, it is known to bond this object to a support, also called handle, to perform the desired treatment, and then to separate the object from the handle at the end of the treatment. The object may be attached to a rigid frame via an adhesive film to allow the separation from the handle. An adhesive film comprises a support film covered with a glue layer.

The object may comprise raised portions on the side attached to the adhesive film. When the object corresponds to a wafer, the raised portions may correspond to electronic components formed on the surface of the wafer attached to the adhesive film. The glue layer of the adhesive film must then have a sufficient thickness to encapsulate the raised portions to obtain a sufficient adhesion of the object to the adhesive film. However, if the glue thickness is too significant, it may come into contact with the handle and hinder, or even prevent, the separation of the handle.

SUMMARY

Thus, an object of an embodiment is to at least partly overcome the disadvantages of the previously-described temporary bonding methods.

Another object of an embodiment is for the object to be able to have raised portions having a height greater than several micrometers.

An embodiment provides a method of temporary bonding of an object having first and second opposite surfaces successively comprising bonding the object to a handle on the side of the first surface, bonding the object to a first adhesive film on the side of the second surface, bonding the first adhesive film to a second adhesive film on the side opposite to the object, and removing the handle from the object.

According to an embodiment, the first adhesive film comprises a first support film covered with a first glue layer, the bonding of the object to the first adhesive film being performed on the side of the first glue layer, the first glue layer coming into contact with the handle after the bonding of the object to the first adhesive film.

According to an embodiment, the thickness of the first glue layer is in the range from 10 µm to 300 µm.

According to an embodiment, the thickness of the first support film is in the range from 50 µm to 500 µm.

According to an embodiment, the second adhesive film comprises a second support film covered with a second glue layer, the bonding of the first adhesive film to the second adhesive film being performed on the side of the first support film and of the second glue layer, where the second glue layer does not come into contact with the handle after the bonding of the first adhesive film to the second adhesive film.

According to an embodiment, the object comprises a silicon wafer.

According to an embodiment, the object comprises electric components at least partly raised with respect to the second surface.

According to an embodiment, the method comprises a step of thinning of the object after the bonding of the object to the handle and before the bonding of the object to the first adhesive film.

According to an embodiment, the method comprises a step of cutting of the peripheral portion of the first adhesive film after the bonding of the object to the first adhesive film and before the bonding of the first adhesive film to the second adhesive film to release the circumference of the handle.

According to an embodiment, the cutting step is carried out by means of a cutting blade or of a diamond saw.

According to an embodiment, the method comprises a step of removal of the portions of the first glue layer in contact with the handle, after the bonding of the object to the first adhesive film and before the bonding of the first adhesive film to the second adhesive film.

According to an embodiment, the step of removal of the portions of the first glue layer in contact with the handle comprises a chemical etch step.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, handle separation methods are well known by those skilled in the art and are not described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. Unless specified otherwise, the expressions "around", "approximately", "substantially" and "in the order of" signify within 10%, and preferably within 5%.

FIGS. 1A to 1G are partial simplified cross-section views of structures obtained at successive steps of an example of a method of temporary bonding of an object 10 (S1), particularly a silicon wafer.

Figure 1A:
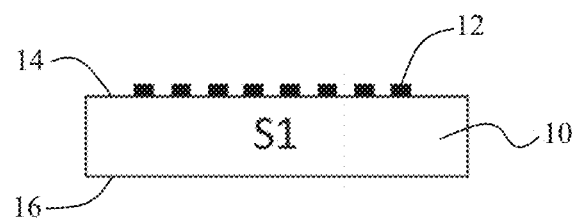
FIG. 1A is a partial simplified cross-section view of the structure obtained at a step of an example of a method of temporary bonding of a wafer.

The method includes the successive steps of:
manufacturing electric components 12 on wafer 10 and in wafer 10, wafer 10 comprising opposite upper and lower surfaces 14 and 16, electric components 12 being located on the side of upper surface 14 (FIG. 1A);
attaching a glue layer 18 adhering to electric components 12 and to the upper surface 14 of wafer 10 between electric components 12 (FIG. 1B);
attaching a handle 20 (S2), for example, another silicon wafer, to glue layer 18, on the side of glue layer 18 opposite to wafer 10 (FIG. 1C);
thinning silicon wafer 10 on the side of lower surface 16 and routing silicon wafer 10 and possibly a portion of handle 20 (FIG. 1D);
forming electric components 22 on the thinned silicon wafer 10 and in the thinned silicon wafer 10, the electric components 22 being located on the side of lower surface 16 (FIG. 1E);
bonding the assembly comprising wafer 10 and handle 20 to a rigid frame 24 via an adhesive film 26, adhesive film 26 comprising a support film 28 covered with a glue layer 30 (FIG. 1F); and
removing handle 20 (FIG. 1O).

Treatments may be subsequently performed on wafer 10. According to an example, wafer 10 may be cut.

At least some of the electric components 22 present on the lower surface 16 of wafer 10 may have a height greater than several micrometers, particularly greater than 10 µm, with respect to lower surface 16. To protect these components 22 during the attaching of the assembly comprising wafer 10 and handle 20 onto frame 24 by means of adhesive film 26, and to ensure a proper adhesion of the assembly comprising wafer 10 and handle 20 to frame 24, it is necessary for the thickness of glue layer 30 to be sufficient to completely encapsulate components 22.

Figure 1B:
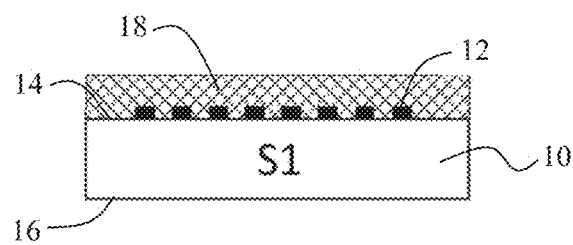
FIG. 1B illustrates another step of the method.
Figure 1C:
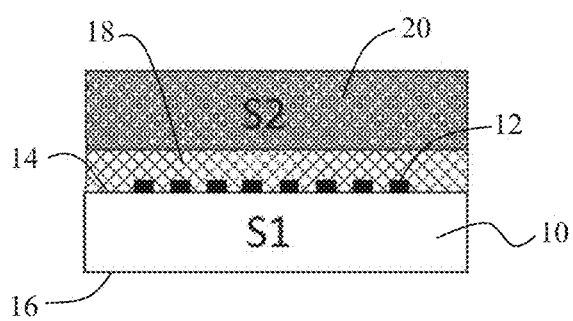
FIG. 1C illustrates another step of the method.
Figure 1D:
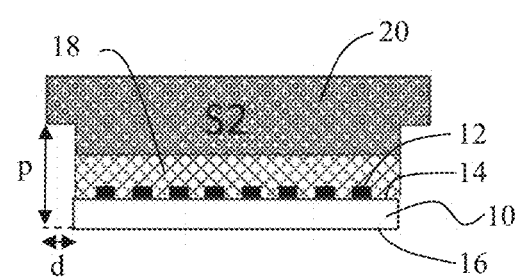
FIG. 1D illustrates another step of the method.
Figure 1E:
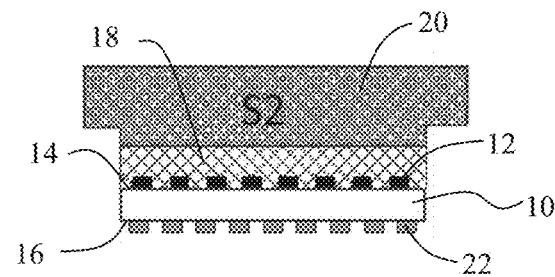
FIG. 1E illustrates another step of the method.
Figure 1F:
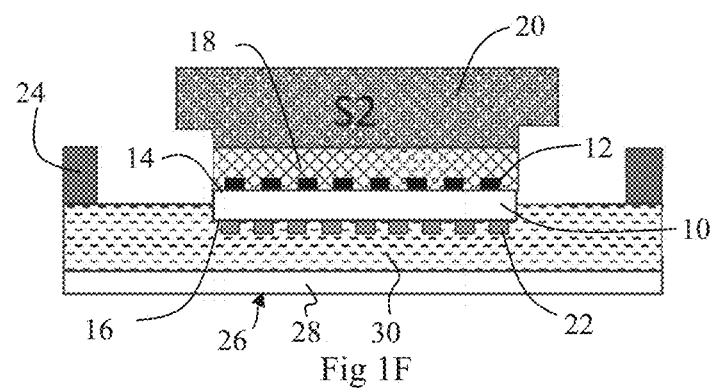
FIG. 1F illustrates another step of the method.
Figure 1G:
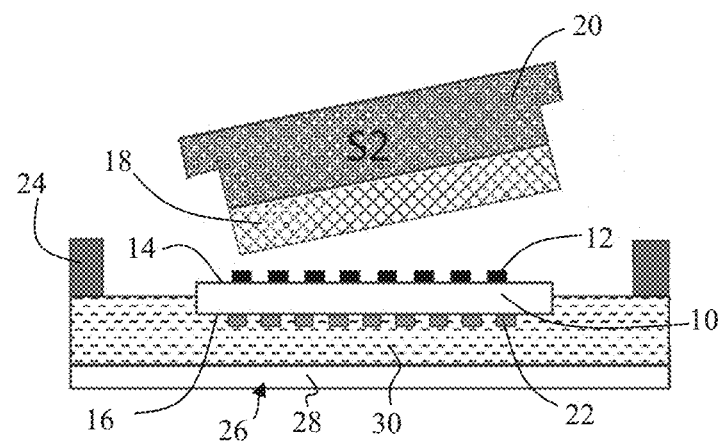
FIG. 1G illustrates another step of the method.
Figure 2:
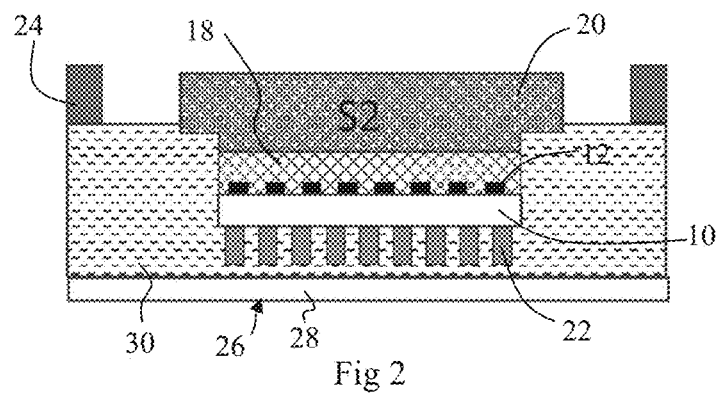
FIG. 2 is a partial simplified cross-section view of the structure obtained at a step of an example of a temporary bonding method illustrating a disadvantage of the bonding method.

FIG. 2 is a partial simplified cross-section view similar to FIG. 1F illustrating the case where a glue layer 30 having a high thickness is used, particularly due to the dimensions of electric components 22. As shown in the drawing, the edge of handle 20 may come into contact with the glue layer 30 of adhesive film 26. The removal of handle 20 from wafer 10 may then not be possible.

FIGS. 3A to 3D are partial simplified cross-section views of structures obtained at successive steps of an embodiment of a method of temporary bonding of an object, particularly a silicon wafer.

The initial steps of the method may correspond to the steps previously described in relation with FIGS. 1A to 1F.

In particular, wafer 10 may have a cylindrical shape with a diameter in the range from 25.4 mm to 450 mm, for example equal to approximately 300 mm. The thickness of wafer 10 before thinning may be in the range from 300 µm to 2,000 µm, for example, equal to approximately 775 µm. Further, handle 20 may have a cylindrical shape with a diameter in the range from 25.4 mm to 450 mm, for example equal to approximately 300 mm. The thickness of handle 20 may be in the range from 300 µm to 2,000 µm, for example, equal to approximately 775 µm. Electric components 12, 22 may be electronic circuit components. A plurality of electronic circuits may be formed on wafer 10, for example several copies of a same electronic circuit.

Further, at the bonding step previously described in relation with FIGS. 1B and 1C, glue layer may comprise a polymer or a mixture of polymers, particularly cyclic olefin, epoxy, acrylic, styrene, vinyl halide, vinyl ester, polyamide, polyimide, polysulphone, polyestersulphone, polyolefin rubber, polyurethane, ethylene-propylene rubber, polyamide ester, polyimide ester, and polyacetal polymers. As an example, glue layer 18 may correspond to the product commercialized by Brewer Science under name Brewer-BOND®305. The thickness of glue layer 18 may be in the range from 1 µm to 100 µm, for example, equal to 20 µm. According to an embodiment, glue layer 18 may be spread on surface 14 by spin coating in the case of a liquid glue formulation. Glue layer 18 may also be available in the form of a dry film and in this case, it is arranged on a support film, not shown, the assembly being applied on the upper surface 14 of wafer 10 on the side of glue layer 18, and the support film being removed, particularly by delamination. An anti-adhesive layer intended to ease the disassembly between handle 20 and glue layer 18 may be previously formed on the surface of handle 20 intended to come into contact with glue layer 18. This anti-adhesive layer is for example a layer of the fluorinated product sold by 3M under name 3M™ Novec™ 2702. Handle 20 is applied against glue layer 18, and the cohesion of glue layer 18 is achieved by heating, for example at a temperature in the order of 200° C.

Further, the steps previously described in relation with FIG. 1D may comprise a step of thinning of wafer 10. The thickness of wafer 10 after the thinning step may be in the range from 20 µm to 300 µm, for example, equal to approximately 50 µm. The step of thinning of wafer 10 may be carried out by means of a diamond wheel.

Further, the steps previously described in relation with FIG. 1D may comprise a step of routing of the assembly comprising wafer 10 and handle 20, that is, the removal of a portion of the assembly comprising wafer 10 and handle 20 from all or part of the periphery of the assembly comprising wafer 10 and handle 20. This particularly enables to decrease, or even to suppress, the chipping of wafer 10 when it is thinned. The routing step may comprise the removal of a portion of wafer 10 from the entire periphery of wafer 10 along a distance d in the range from 0.5 mm to 5 mm and/or down to a depth p in the range from 30 µm to 300 µm. The routing step may be carried out by means of a diamond saw.

Figure 3A:
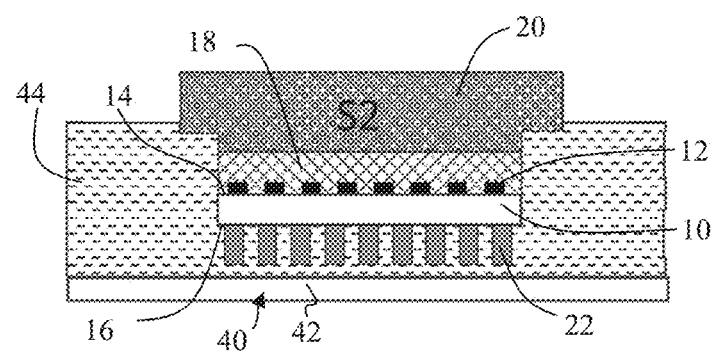
FIG. 3A is a partial simplified cross-section view of the structure obtained at a step of an embodiment of a temporary wafer bonding method.

FIG. 3A shows the structure obtained after the attaching of a first adhesive film 40 to the assembly comprising wafer 10 and handle 20. First adhesive film 40 is attached to the assembly comprising wafer 10 and handle 20 on the side of the lower surface 16 of wafer 10. First adhesive film 40 comprises a support film 42 covered with a glue layer 44, glue layer 44 coming into contact with the assembly comprising wafer 10 and handle 20 during the attaching of adhesive film 40. The thickness of glue layer 44 is sufficient to completely encapsulate electric components 22. Glue layer 44 may come into contact with handle 20 as shown in FIG. 3A. First adhesive film 40 may be attached to the assembly comprising wafer 10 and handle 20 by lamination, that is, by the placing into contact of the first adhesive film 40, on the side of glue layer 44, with the assembly comprising wafer 10 and handle 20 with the application of a pressure and possibly under vacuum.

A glue layer 44 of first adhesive film 40 may comprise a polymer or a polymer mixture, particularly cyclic olefin, epoxy, acrylic, styrene, vinyl halide, vinyl ester, polyamide, polyimide, polysulphone, polyestersulphone, polyolefn rubber, polyurethane, ethylene-propylene rubber, polyamide ester, polyimide ester, and polyacetal polymers. The thickness of glue layer 44 may be in the range from 10 to 300 µm, for example, equal to approximately 130 µm. Support film 42 may comprise a polymer or a polymer mixture, particularly polyethylene terephthalate (PET), silicone-treated polyethylene terephthalate, polyimide, polyethylene, polyolefin, and polycarbonate. The thickness of support film 42 may be in the range from 50 µm to 500 µm, for example, equal to 100 µm. As an example, first adhesive film 40 may correspond to the product commercialized by Furukawa Electric under trade name Furukawa SP-537T-230 or to the product commercialized by Lintec Corporation under trade name Adwill D-650.

Figure 3B:
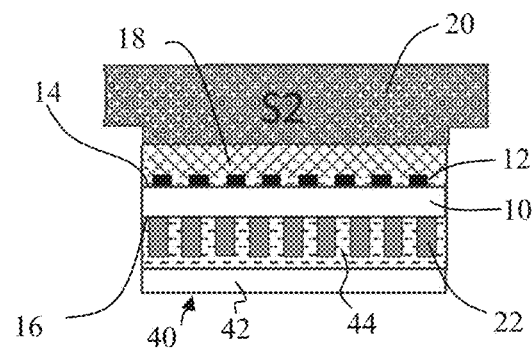
FIG. 3B illustrates another step of the method.

FIG. 3B shows the structure obtained after an operation of cutting of first adhesive film 40 to release the circumference of handle 20. A cleaning operation may further be carried out to remove the portions of glue layer 44 possibly in contact with handle 20. The step of cutting of first adhesive film 40 may be carried out by means of a cutting blade or of a diamond saw. The cleaning step may be carried out by chemical etching of the portions of glue layer 44 possibly in contact with handle 20, for example, by using an adapted solvent, particularly limonene.

Figure 3C:
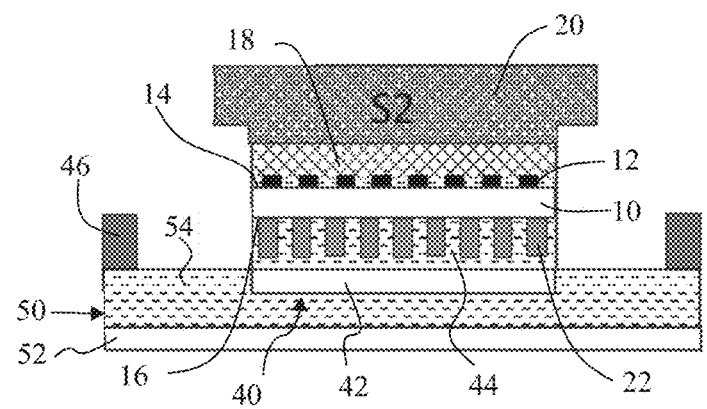
FIG. 3C illustrates another step of the method.

FIG. 3C shows the structure obtained after an attaching of the assembly comprising wafer 10, handle 20, and first adhesive film 40 to a rigid frame 46 via a second adhesive film 50. The second adhesive film 50 comprises a support film 52 covered with a glue layer 54. The assembly is oriented so that the support film 42 of first adhesive film 40 comes into contact with the glue layer 54 of second adhesive film 50. Since the support film 42 of first adhesive film 40 is substantially planar, the thickness of the glue layer 54 of second adhesive film 50 may be smaller than the thickness of the glue layer 44 of first adhesive film 40. However, the thickness of the glue layer 54 of second adhesive film 50 may be equal to or greater than the thickness of the glue layer 44 of first adhesive film 40 as long as the glue layer 54 of second adhesive film 50 does not come into contact with handle 20. The thickness of the glue layer 54 of second adhesive film 50 may be in the range from 10 µm to 150 µm. The glue layer 54 of second adhesive film 50 may be made of one of the materials previously described for the glue layer 44 of first adhesive film 40. The support film 52 of second adhesive film 50 may be made of one of the materials previously described for the support film 42 of first adhesive film 40. As an example, first adhesive film 40 may correspond to the product commercialized by Furukawa Electric under trade name Furukawa SP-537T-230 or to the product commercialized by Lintec Corporation under trade name Adwill D-650.

Figure 3D:
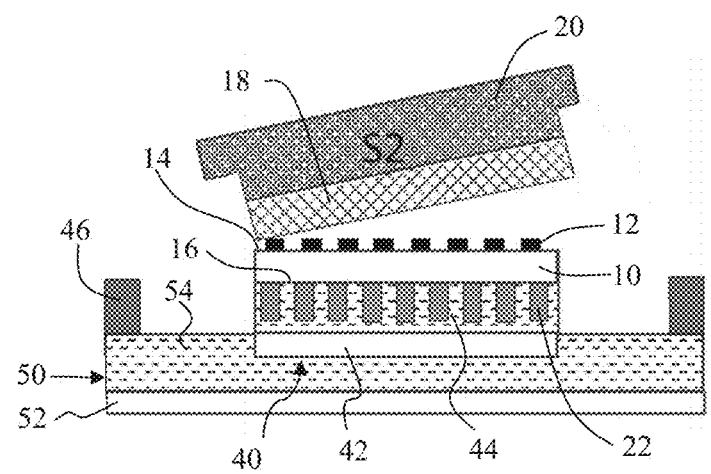
FIG. 3D illustrates another step of the method.

FIG. 3D shows the structure obtained after the removal of handle 20 from wafer 10. The removal of handle 20 may be performed by a mechanical action or by a mechanical action associated with a chemical action or by a mechanical action associated with a laser irradiation.

Treatments may be subsequently carried out on wafer 10. According to an example, wafer 10 may be cut, for example, to separate the electronic circuits formed on wafer 10, adhesive films 40 and 50 and frame 46 enabling to hold wafer 10 during the cutting operation. According to another example, wafer 10 or the cut portions of wafer 10 may be detached from first adhesive film 40. The separation method will depend on the nature of this adhesive film: in the case of a UV-crosslinkable polymer (acrylate), a UV illumination enables to decrease its adhesion, in the case of a temperature-sensitive polymer, an anneal enables to degrade the adhesive and to decrease its adhesion.

Various embodiments and variants have been described. According to another embodiment, it is possible not to carry out the step of routing of wafer 10, as previously described in relation with FIG. 1D, just after the thinning of wafer 10, but to carry it out before the steps previously described in relation with FIG. 1B, that is, before the deposition of glue layer 18. Further, although handle 20 has been described as being capable of being a silicon wafer, it should be clear that handle 20 may be made of any material allowing the bonding of handle 20 to wafer 10 and the handling of wafer 10. It will be understood by those skilled in the art that certain features of these various embodiments and variants may be combined, and other variants will occur to those skilled in the art. Finally, the practical implementation of the described embodiments and variations is within the abilities of those skilled in the art based on the functional indications given hereabove.

The invention claimed is:

1. Method of temporary bonding of an object having first and second opposite surfaces successively comprising bonding the object to a handle on the side of the first surface, bonding the object to a first adhesive film on the side of the second surface, bonding the first adhesive film to a second adhesive film on the side opposite to the object, and removing the handle from the object.

2. Method according to claim 1, wherein the first adhesive film comprises a first support film covered with a first glue layer, the bonding of the object to the first adhesive film being performed on the side of the first glue layer, the first glue layer coming into contact with the handle after the bonding of the object to the first adhesive film.

3. Method according to claim 2, wherein the thickness of the first glue layer is in the range from 10 µm to 300 µm.

4. Method according to claim 2, wherein the thickness of the first support film is in the range from 50 µm to 500 µm.

5. Method according to claim 2, wherein the second adhesive film comprises a second support film covered with a second glue layer, the bonding of the first adhesive film to the second adhesive film being performed on the side of the first support film and of the second glue layer, where the second glue layer does not come into contact with the handle after the bonding of the first adhesive film to the second adhesive film.

6. Method according to claim 1, wherein the object comprises a silicon wafer.

7. Method according to claim 6, wherein the object comprises electric components at least partly raised with respect to the second surface.

8. Method according to claim 1, comprising a step of thinning of the object after the bonding of the object to the handle and before the bonding of the object to the first adhesive film.

9. Method according to claim 1, comprising a step of cutting a peripheral portion of the first adhesive film after the bonding of the object to the first adhesive film and before the bonding of the first adhesive film to the second adhesive film to release a circumference of the handle.

10. Method according to claim 9, wherein the cutting step is carried out by means of a cutting blade or of a diamond saw.

11. Method according to claim 9, wherein the first adhesive film comprises a first support film covered with a first glue layer, the bonding of the object to the first adhesive film being performed on the side of the first glue layer, the first glue layer coming into contact with the handle after the bonding of the object to the first adhesive film, the method comprising a step of removal of portions of the first glue layer in contact with the handle, after the bonding of the object to the first adhesive film and before the bonding of the first adhesive film to the second adhesive film.

12. Method according to claim 11, wherein the step of removal of the portions of the first glue layer in contact with the handle comprises a chemical etch step.

* * * * *